(12) United States Patent
Ha

(10) Patent No.: US 7,626,872 B2
(45) Date of Patent: Dec. 1, 2009

(54) SEMICONDUCTOR MEMORY DEVICE AND ITS DRIVING METHOD

(75) Inventor: Sung-Joo Ha, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 82 days.

(21) Appl. No.: 11/824,314

(22) Filed: Jun. 29, 2007

(65) Prior Publication Data
US 2008/0062778 A1 Mar. 13, 2008

(30) Foreign Application Priority Data
Aug. 31, 2006 (KR) .................... 10-2006-0083531

(51) Int. Cl.
*G11C 7/10* (2006.01)
(52) U.S. Cl. ............... 365/189.17; 365/189.15; 365/189.14; 365/189.16; 365/189.19
(58) Field of Classification Search ........... 365/189.15, 365/189.14, 189.16, 189.17, 189.19
See application file for complete search history.

(56) References Cited

U.S. PATENT DOCUMENTS 6,062,328 A * 5/2000 Campbell et al. .......... 180/65.6
6,072,749 A * 6/2000 Nakamura et al. ......... 365/238.5
2003/0133350 A1* 7/2003 Nakao .................... 365/230.03
2006/0176729 A1* 8/2006 Chan et al. ................. 365/154
2006/0176753 A1* 8/2006 Chan et al. ............. 365/230.03
2007/0002672 A1* 1/2007 Ha et al. ................. 365/230.06

FOREIGN PATENT DOCUMENTS

| KR | 1997-0060789 | 8/1997 |
|----|--------------|--------|
| KR | 1999-003110 | 1/1999 |
| KR | 1999-0057796 | 7/1999 |

* cited by examiner

*Primary Examiner*—Thong Q Le
(74) *Attorney, Agent, or Firm*—Blakely, Sokoloff, Taylor & Zafman LLP

(57) ABSTRACT

A semiconductor memory device includes a data transfer line for read, a data signal transfer unit, a reset controller, and a data signal transfer unit for write. The data signal transfer unit for read receives a first data signal corresponding to a read command via the data transfer line and outputs the first data signal. The reset controller resets the data transfer line in response to a reset signal. The data signal transfer unit for write receives a second data signal corresponding to a write command, and outputs the second data signal to the data transfer line. The data transfer line is reset in response to the reset signal.

19 Claims, 5 Drawing Sheets

SEMICONDUCTOR MEMORY DEVICE AND ITS DRIVING METHOD

CROSS-REFERENCE TO RELATED APPLICATIONS

The present invention claims priority of Korean patent application number 10-2006-0083531, filed on Aug. 31, 2006, which is incorporated by reference in its entirety.

BACKGROUND OF THE INVENTION

The present invention relates to a semiconductor memory device; and, more particularly, to a data transfer circuit for a write operation in the semiconductor memory device.

As well-known in the art, a semiconductor memory device is a semiconductor device which stores a large amount of data and provides desired data among the stored data. The main operations of the semiconductor memory device include a write operation for storing data and a read operation for outputting selected data out of the stored data. Further, there exists a precharge operation for getting the read and write operations ready when those operations are not done. In addition, it is required that the semiconductor memory device that uses a capacitor as a data storage unit like DRAM performs a refresh operation for compensating the natural leakage of signal stored in the capacitor.

Such a semiconductor memory device is embodied in a manner that the unit cells that are the basic component for data storage are arranged in a matrix form in order to efficiently store a large amount of data. Each of the unit cells arranged in the matrix form is disposed at a point where each of word lines in a horizontal direction intersects each of bit lines in a vertical direction. Each of the word lines corresponds to a row address, while each of the bit lines corresponds to a column address. In general, in case of performing the read or write operation, a row address is first taken to select a corresponding one of the word lines. Then, a column address is received to select a corresponding one of the bit lines. The data of a unit cell designated by the selected word line and bit line denotes data to be accessed.

For more efficient structure, the semiconductor device receives both a row address and a column address through one address input pad, and shares a pad through which data is inputted or outputted. During the read operation, data is outputted through the input/output pad, and during the write operation, data is inputted through the input/output pad. For this, one data transfer path is established between the unit cell and the input/output pad. In the data transfer path, a transfer circuit for data write and a transfer circuit for data read are provided for transferring data in predetermined directions during the read and write operations.

To transfer data corresponding to a read command from a data transfer line to outside and transfer data corresponding to a write command from the outside to a data storage area via one data transfer line as above, the transfer circuits for data write and read have to accurately transfer data in preset directions in response to the corresponding commands. Further, it needs to reset the data transfer line in order to convey the data corresponding to the write command via the same after outputting the data corresponding to the read command to the outside via it. If it fails to reset the data transfer line normally, the data signal corresponding to the read command collides with the data signal corresponding to the write command on one data transfer line, which may cause an error.

SUMMARY OF THE INVENTION

Embodiments of the present invention are directed to provide a data transfer line reset more easily when read data and written data are transferred through single data transfer line for reliably performing the operations corresponding to a read command and a write command continuously.

In accordance with an aspect of the present invention, there is provided a semiconductor memory device including a data transfer line for read, a data signal transfer unit for read, a reset controller, and a data signal transfer unit for write. The data signal transfer unit for read receives a first data signal corresponding to a read command via the data transfer line and outputs the first data signal. The reset controller resets the data transfer line in response to a reset signal. The data signal transfer unit for write receives a second data signal corresponding to a write command, and outputs the second data signal to the data transfer line. The data transfer line is reset in response to the reset signal.

In accordance with another aspect of the present invention, there is provided a semiconductor memory device including a data transfer line, a data signal transfer unit for read, and a data signal transfer unit for write. The data signal transfer unit for read receives a first data signal corresponding to a read command via the data transfer line, and outputs the first data signal. The data signal transfer unit for write takes a second data signal corresponding to a write command and outputs the second data signal via the data transfer line. The data transfer line is reset in response to a reset signal.

In accordance with still another aspect of the present invention, there is provided a driving method of a semiconductor memory device including transferring a first data signal corresponding to a read command through a data transfer line; outputting the first data signal transferred through the data transfer line to outside; driving, at a driving circuit, the data transfer line by using a second data signal corresponding to a write command; storing a signal corresponding to the driving result of the data transfer line in a data storage area; and resetting the data transfer line at the driving circuit.

In accordance with still another aspect of the present invention, there is provided a driving method of a semiconductor memory device including transferring a first data signal corresponding to a read command through a data transfer line; outputting the first data signal transferred through the data transfer line to outside; driving, at a driving circuit, the data transfer line by using a second data signal corresponding to a write command; storing a signal corresponding to the driving result of the data transfer line in a data storage area; resetting, at a reset controller, the data transfer line in response to a reset signal; and performing, at the driving circuit, a reset operation of the data transfer line in response to the reset signal.

In accordance with still another aspect of the present invention, there is provided a semiconductor memory device including a first data transfer line; a second data transfer line; and a driver for driving data of the first data transfer line to the second data transfer line, wherein the driver resets the second data transfer line to a reset voltage in response to a reset signal.

DESCRIPTION OF SPECIFIC EMBODIMENTS

Hereinafter, a preferred embodiment of the present invention will be set forth in detail with reference to the accompanying drawings to a degree so that a person skilled in the art can easily carry out the invention.

Figure 1:
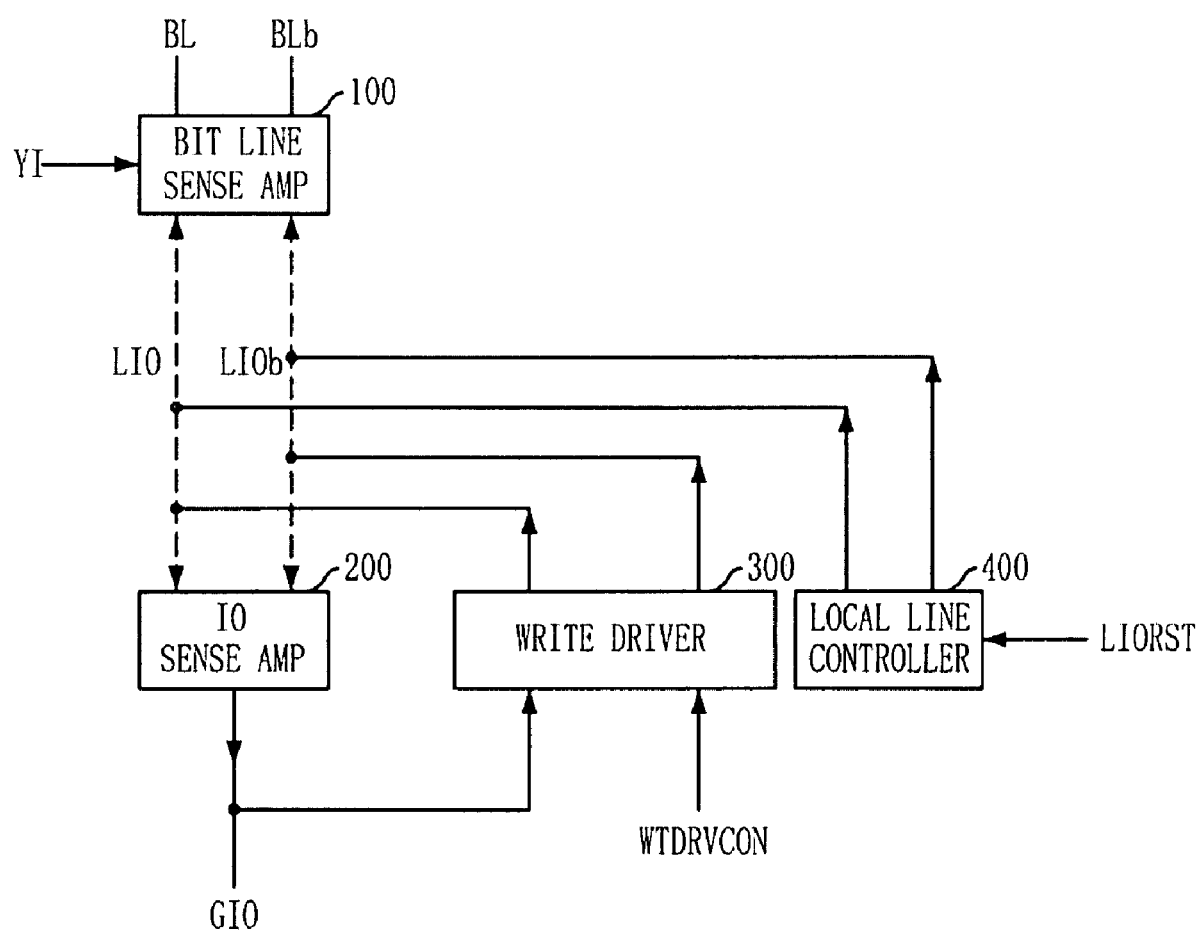
FIG. 1 shows a block diagram of a semiconductor memory device.

FIG. 1 shows a block diagram for data input/output in a semiconductor memory device.

Referring to FIG. 1, the semiconductor memory device is provided with a bit line sense amp 100, an IO sense amp 200, a write driver 300 and a local line controller 400. The bit line sense amp 100 serves to sense and amplify a data signal applied to bit lines BL and BLb and output an amplified signal to local lines LIO and LIOb. The data signal applied to the bit lines BL and BLb is a signal, which was stored in a data storage area and is then provided to the local lines LIO and LIOb corresponding to a read command. The IO sense amp 200 latches and amplifies the data signal transferred through the local lines LIO and LIOb to provide an amplified signal to a global line GIO. The write driver 300 delivers the data signal inputted through the global line GIO to the local lines LIO and LIOb in response to a write signal WTDRVCON created by a write command. The local line controller 400 functions to control the reset operation of the bit lines LIO and LIOb in response to a control signal LIORST.

Figure 2:
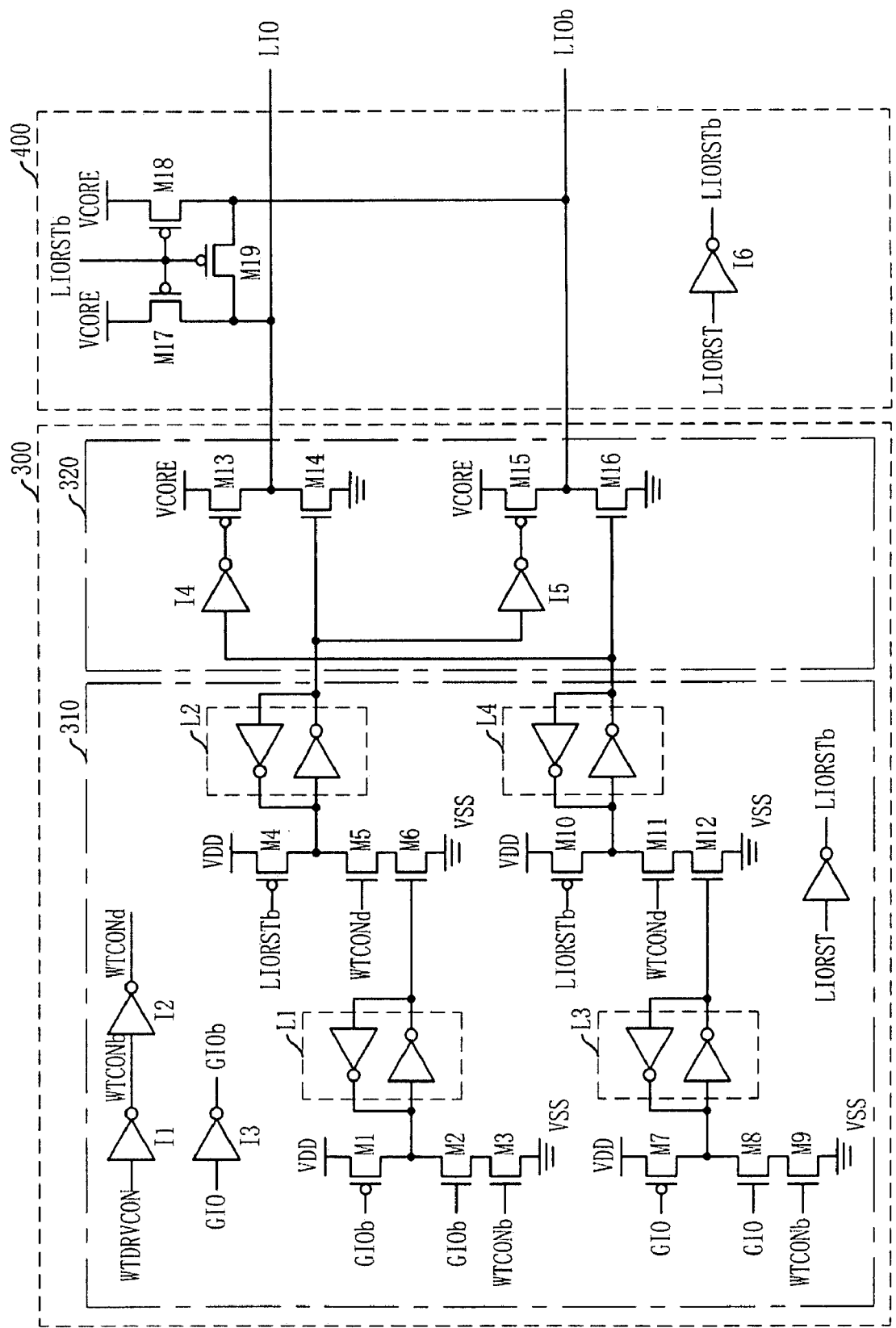
FIG. 2 provides a detailed circuit diagram of the write driver depicted in FIG. 1.

FIG. 2 provides a detailed circuit diagram of the write driver 300 and the local line controller 400 depicted in FIG. 1.

Referring to FIG. 2, the write driver 300 includes a data signal latch circuit 310 for receiving and latching the data signal transferred through the global line GIO in response to the control signal WTDRVCON, and a data signal driver 320 for driving the local lines LIO and LIOb by using the data latched by the data signal latch circuit 310 for write. The local line controller 400 resets the local lines LIO and LIOb to a core voltage VCORE in response to a control signal LIORSTb, after the signal from the data signal driver 320 is delivered to the bit line sense amp 100 via the local lines LIO and LIOb.

Figure 3:
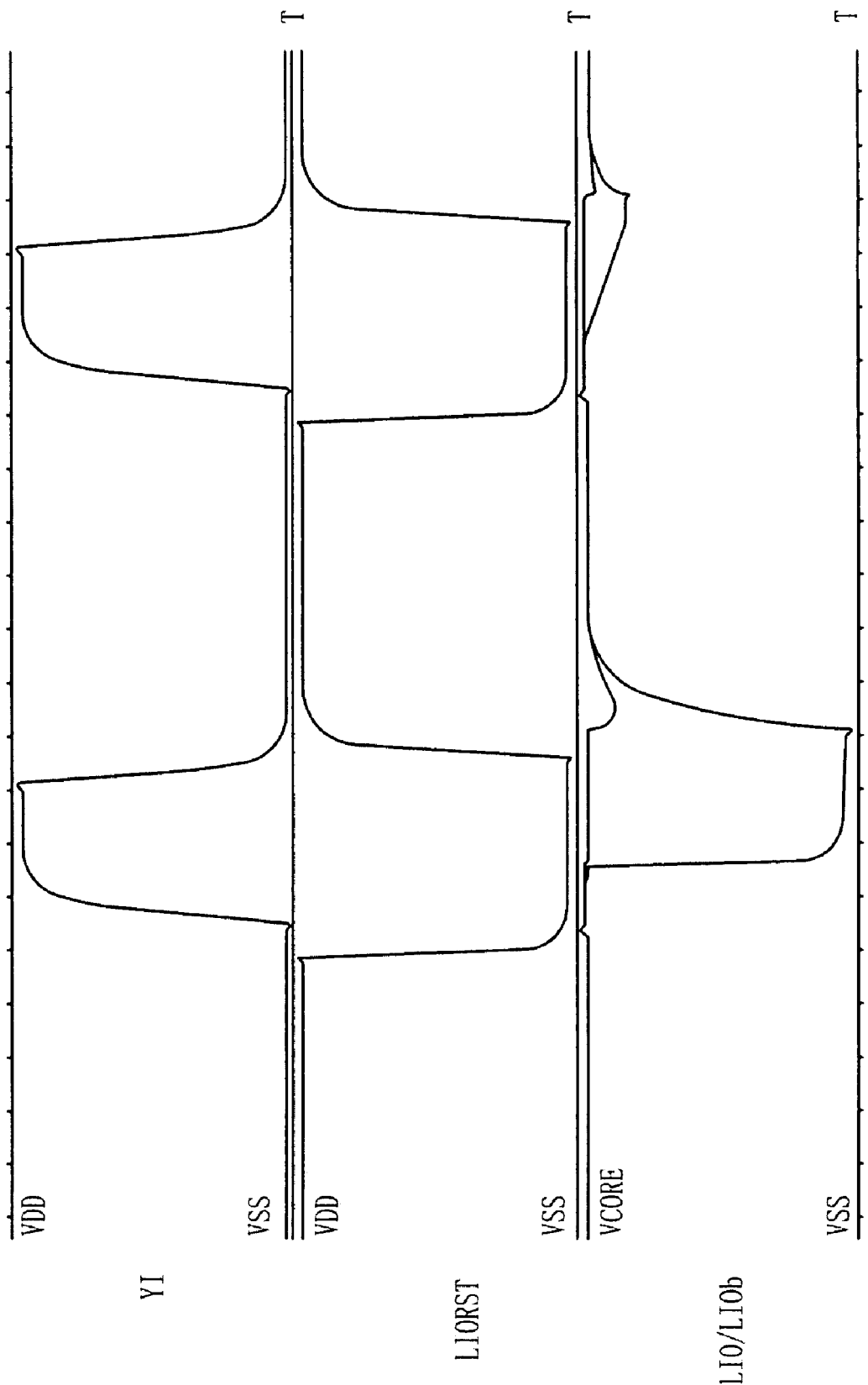
FIG. 3 is a waveform diagram describing the operation of the semiconductor memory device shown in FIG. 1.

FIG. 3 is a waveform diagram describing the operation of the semiconductor memory device shown in FIG. 1.

Referring to FIG. 3, in case of performing the write operation in response to a write command WT, the bit line sense amp 100 takes a data signal applied to the local lines LIO and LIOb when a control signal YI is enabled to a high level. In case of performing the read operation in response to a read command RT, the bit line sense amp 100 outputs a data signal to the local lines LIO and LIOb when the control signal YI is enabled to a high level. When the data signal is applied to the local lines LIO and LIOb, the control signal LIORST is a low level which becomes a disable state.

The data signal inputted in response to the write command WT drives the local lines LIO and LIOb with a core voltage level VCORE and a ground voltage level VSS, respectively, the data signal corresponding to the read command can drive the local lines LIO and LIOb to a predetermined level. This is because the driving capability of the data signal from the bit line sense amp 100 in response to the read command is less than that of the data signal from the outside in response to the write command.

In succession, the local line controller 400 resets the local lines LIO and LIOb to the core voltage VCORE when the data corresponding to the read command or write command passes through the local lines LIO and LIOb. If an operating clock frequency of the semiconductor memory device is high, there is a reduction of time that is necessary for the local line controller 400 to reset the local lines LIO and LIOb. Furthermore, operation characteristics of the local line controller 400 can change according to variations of temperature, a level of an inputted power supply voltage, and manufacturing process, there may be an additional reduction of time that is taken for the local line controller 400 to reset the local lines LIO and LIOb.

Therefore, there may be a case where the local line controller 400 does not reset the local lines LIO and LIOb within a preset time. Namely, the local line controller 400 does not increase the voltage level of the local lines LIO and LIOb to the core voltage level for a preset reset time. In particular, it is more difficult for the local line controller 400 to reset the local lines LIO and LIOb after the data signal is applied to the local lines LIO and LIOb in response to the write command. Since the data signal inputted in response to the write command is relatively greater in driving capability than the data signal inputted in response to the read command, the driving capability of the signal outputted from the write driver is also large. Therefore, it may take much time for the local line controller 400 to reset the local lines LIO and LIOb to the core voltage VCORE after passing the data signal corresponding to the write command through the local lines LIO and LIOb. If the local line controller 400 does not reset the local lines LIO and LIOb within the preset time, the data signal corresponding to the read command which is performed in succession cannot be normally delivered to the IO sense amp 100 through the local lines LIO and LIOb.

Figure 4:
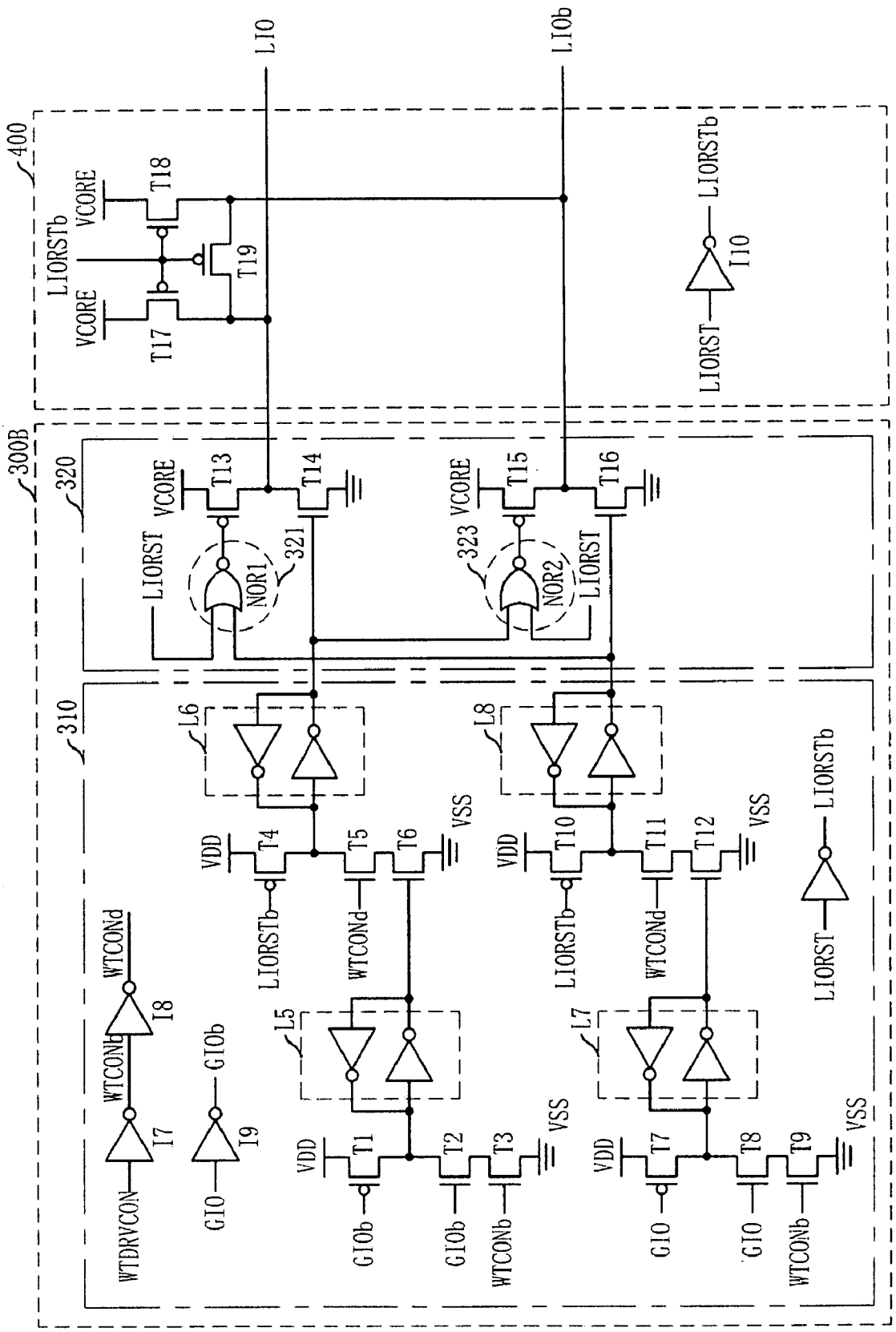
FIG. 4 illustrates a circuit diagram of a write driver in accordance with a first preferred embodiment of the present invention.

FIG. 4 illustrates a detailed circuit diagram of a data transfer unit for write in accordance with a first preferred embodiment of the present invention.

Referring to FIG. 4, a data transfer unit 300B for write in accordance with a first embodiment of the invention outputs a data signal corresponding to a write command provided from a global line GIO to local lines LIO and LIOb. The global line GIO is a data transfer line which conveys a data signal outputted from a data input buffer to a write driver 320. The local lines LIO and LIOb are the ones which carry the data signal from the write driver 320 to a bit line sense amp arranged in a data storage area. Further, the local lines LIO and LIOb and the global line GIO are used to transfer a data signal corresponding to a read command.

The signal transfer unit 300B for write is provided with a data signal latch unit 310 and the write driver 320. The data signal latch unit 310 takes and latches a data signal provided through the global line GIO in response to a write signal WTDRVCON. In the data signal latch unit 310, a latch circuit L5 latches a data signal transferred through MOS transistors T1 and T2 when the write signal WTDRVCON is enabled to a logic high level. A latch circuit L7 latches a data signal provided through MOS transistors T7 and T8 when the write signal WTDRVCON is enabled to a logic high level. The write signal WTDRVCON is a signal which is created internally by the semiconductor memory device when a write command is inputted thereto. A latch circuit L6 latches a data signal transferred through a MOS transistor T6 when an inverted reset signal LIORSTb is disabled to a logic high level and a buffered write signal WTCONd is enabled to a high level. A latch circuit L8 latches a data signal provided through a MOS transistor T12 when the inverted reset signal LIORSTb is disabled to a logic high level and the buffered write signal WTCONd is enabled to a high level.

The write driver 320 drives the local lines LIO and LIOb by using the data signal latched by the data signal latch unit 310 in response to a low level of the reset signal LIORST, and resets them to a core voltage VCORE which is a reset voltage in response to a high level of the reset signal LIORST. The write driver 320 is provided with a NOR gate NOR1 taking the signal latched by the latch circuit L6 and the reset signal LIORST, a NOR gate NOR2 taking the signal latched by the latch circuit L8 part and the reset signal LIORST, a PMOS transistor T13 for receiving an output of the NOR gate NOR1 via a gate to pull up the local line LIO, an NMOS transistor T14 for receiving the signal latched by the latch circuit L6 to pull down the local line LIO, a PMOS transistor T15 for receiving an output of the NOR gate NOR2 via a gate to pull up the local line LIOb, and an NMOS transistor T16 for receiving the signal latched by the latch circuit L8 to pull down the local line LIOb.

The NOR gate NOR1 inverts and outputs the signal latched by the latch circuit L6 when the reset signal LIORST is a low level. The NOR gate NOR2 inverts and outputs the signal latched by the latch circuit L8 when the reset signal LIORST is a low level. If the data signal of a high level latched by the latch circuit L6 is inputted to the NOR gate NOR2 and the data signal of a low level latched by the latch circuit L8 is inputted to the NOR gate NOR1, the NOR gate NOR2 outputs a data signal of a low level and the NOR gate NOR1 outputs a data signal of a high level. Thus, the MOS transistors T14 and T15 are turned on, which drive the local line LIOb to a low level and the local line LIO to a high level. If the data signal of a low level latched by the latch circuit L6 is inputted to the NOR gate NOR2 and the data signal of a high level latched by the latch circuit L8 is inputted to the NOR gate NOR1, the NOR gate NOR2 outputs a data signal of a high level and the NOR gate NOR1 outputs a data signal of a low level. Thus, the MOS transistors T13 and T16 are turned on, which drive the local line LIOb with a high level and the local line LIO with a low level.

After the data signal applied to the local lines LIO and LIOb by the data transfer unit 300B for write is stored in the data storage area, the reset controller 400 resets a voltage level of the local lines LIO and LIOb to the core voltage VCORE. The reset controller 400 is provided with MOS transistors T17 and T18 for supplying the core voltage VCORE which is the reset voltage to the local lines LIO and LIOb in response to the inverted reset signal LIORSTb, and a PMOS transistor T19 for equalizing a voltage level of the local lines LIO and LIOb in response to the inverted reset signal LIORSTb.

When the reset signal LIORSTb of a low level is inputted, the MOS transistors T17, T18 and T19 of the reset controller 400 are turned on to reset a voltage level of the local lines to the core voltage level. Further, when the reset signal LIORSTb of a high level is inputted, the NOR gates NOR1 and NOR2 always output a low level signal regardless of input signals of the other ends. Thus, the MOS transistors T13 and T15 are turned on, thereby helping to reset the local lines LIO and LIOb to the reset voltage VCORE.

By making sure that the write driver 320 of the data transfer unit 300B for write as well as the reset controller 400 help to reset the local lines LIO and LIOb to the core voltage VCORE, the local lines LIO and LIOb can be reset more easily.

Figure 5:
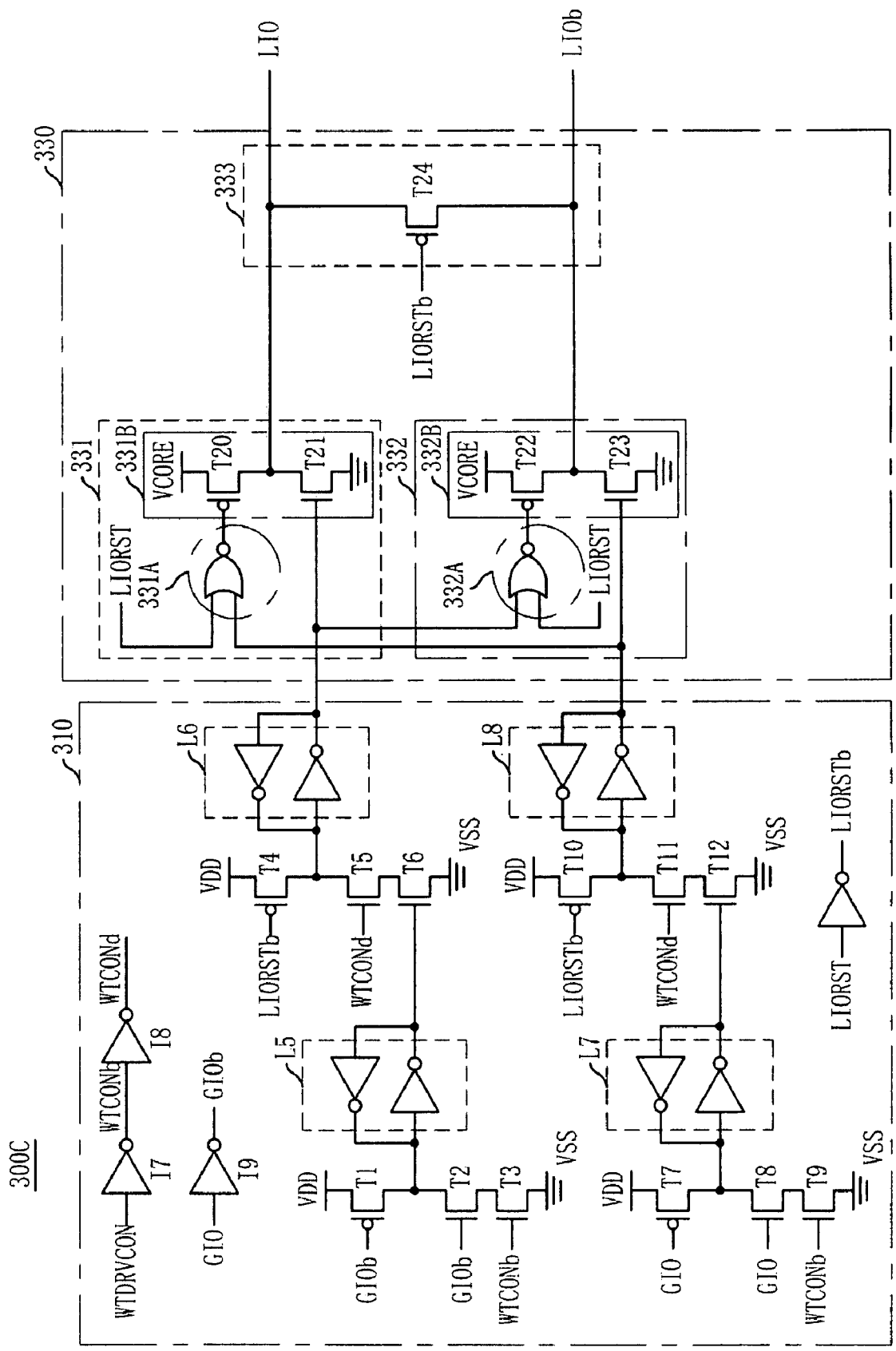
FIG. 5 illustrates a circuit diagram of a write driver in accordance with a second preferred embodiment of the present invention.

FIG. 5 illustrates a circuit diagram of a data transfer unit for write in accordance with a second preferred embodiment of the present invention.

Referring to FIG. 5, a data transfer unit 300C for write in accordance with a second embodiment of the invention is provided with a data latch unit 310 and a write driver 330. The data latch unit 310 has the same structure as the data latch unit shown in FIG. 4 and performs the same operation, and therefore, its details will be omitted here for simplicity. The write driver 330 is implemented by integrating the functions of the write driver 320 and the reset controller 400 of FIG. 4 as a single circuit block. The write driver 330 drives the local lines LIO and LIOb by using the data signal provided by the data latch unit 310. Then, it resets the local lines LIO and LIOb to the core voltage VCORE after the data signal applied to the local lines LIO and LIOb is stored in a data storage area. At this time, the MOS transistor T24 is to equalize a voltage level of the local lines LIO and LIOb.

As described above, according to the present invention, the data transfer line can be reset more easily when read data and written data are transferred through single data transfer line. Accordingly, the present invention allows a semiconductor memory device to reliably perform the operations corresponding to a read command and a write command continuously. In addition, the present invention enables the semiconductor memory device to continuously process data at a high speed.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a first data transfer line;
   a second data transfer line;
   a read data transfer unit for receiving a first data signal corresponding to a read command and outputting the first data signal to the first data transfer line;
   a reset controller for resetting the second data transfer line in response to a reset signal; and
   a write data transfer unit for receiving a second data signal corresponding to a write command from and outputting the second data signal to the second data transfer line,
   wherein the write data transfer unit further resets the second data transfer line in response to the reset signal.

2. The semiconductor memory device as recited in claim 1, wherein the second data transfer line is composed of a first and a second data lines to transmit a pair of data signals.

3. The semiconductor memory device as recited in claim 2, wherein the reset controller includes:
   a reset voltage supplier for supplying a reset voltage to each of the first and the second data lines in response to the reset signal; and
   an equalization circuit for equalizing a voltage level of each of the first and the second data lines in response to the reset signal.

4. The semiconductor memory device as recited in claim 3, wherein the reset voltage supplier includes:
   a first PMOS transistor for supplying the reset voltage to the first data line in response to the reset signal; and
   a second PMOS transistor for supplying the reset voltage to the second data line in response to the reset signal.

5. The semiconductor memory device as recited in claim 4, wherein the equalization circuit is composed of a third PMOS transistor which takes the reset signal via a gate, said PMOS transistor having one end connected to the first data line and a second end connected to the second data line.

6. The semiconductor memory device as recited in claim 2, wherein the write data transfer unit includes:
   a data signal latch unit for latching the second data signal in response to a write signal; and
   a write driver for driving the first and the second data lines by using the data signal to be written, latched by the latch unit, in response to a first logic level of the reset signal, and for resetting the first and the second data lines to a reset voltage in response to a second logic level of the reset signal.

7. The semiconductor memory device as recited in claim 2, wherein the write driver includes:
   a logic circuit for logically combining the data signal latched in the latch unit and the reset signal; and
   a PMOS transistor taking an output of the logical multiplication circuit via a gate.

8. The semiconductor memory device as recited in claim 6, wherein the data signal latch unit includes:
   a first latch circuit for latching a first level of the second data signal in response to the write signal; and
   a second latch circuit for latching a second level of the second data signal in response to the write signal.

9. The semiconductor memory device as recited in claim 8, wherein the write driver includes:
   a first NOR gate taking the signal latched by the second latch circuit and the reset signal;
   a second NOR gate receiving the signal latched by the first latch circuit and the reset signal;
   a first PMOS transistor for receiving an output of the first NOR gate via a gate to pull up the first data line;
   a first NMOS transistor for accepting the signal latched by the first latch circuit via a gate to pull down the first data line;
   a second PMOS transistor for receiving an output of the second NOR gate via a gate to pull up the second data line; and
   a second NMOS transistor for receiving the signal latched by the second latch circuit via a gate to pull down the second data line.

10. A semiconductor memory device comprising:
   a data transfer line;
   a read data signal transfer unit for receiving a first data signal corresponding to a read command and outputting the first data signal, wherein the first data signal is transmitted from the data transfer line;
   a reset controller for resetting the data transfer line in response to a reset signal; and
   a write data signal transfer unit for receiving a second data signal corresponding to a write command and outputting the second data signal to the data transfer line,
   wherein the write data signal transfer unit further resets the data transfer line in response to the reset signal.

11. The semiconductor memory device as recited in claim 10, wherein the data transfer line is composed of a first and a second data transfer lines to carry a pair of data signals.

12. The semiconductor memory device as recited in claim 11, wherein the write data signal transfer unit includes:
   a data signal latch unit for latching the second data signal in response to a write signal;
   a write driver for driving the first and the second data transfer lines by using the data signal to be written, latched by the latch unit, in response to a first logic level of the reset signal, and for resetting the first and the second data transfer lines to a reset voltage in response to a second logic level of the reset signal; and
   an equalization circuit for equalizing a voltage level of each of the first and the second data transfer lines in response to the reset signal.

13. The semiconductor memory device as recited in claim 12, wherein the equalization circuit is composed of a first PMOS transistor which takes the reset signal via a gate, and whose one end and the other end are connected to the first and the second data transfer lines, respectively.

14. The semiconductor memory device as recited in claim 13, wherein the write driver includes:
   a logic circuit for logically combining the data signal latched by the latch unit by the reset signal; and
   a second PMOS transistor taking an output of the logical multiplication circuit via a gate.

15. The semiconductor memory device as recited in claim 12, wherein the data signal latch unit includes:
   a first latch circuit for latching a first level of the second data signal in response to the write signal; and
   a second latch circuit for latching a second level of the second data signal in response to the write signal.

16. The semiconductor memory device as recited in claim 15, wherein the write driver includes:
   a first NOR gate taking the signal latched by the second latch circuit and the reset signal;
   a second NOR gate taking the signal latched by the first latch circuit and the reset signal;
   a first PMOS transistor for receiving an output of the first NOR gate via a gate to pull up the first data transfer line;
   a first NMOS transistor for receiving the signal latched by the first latch circuit via a gate to pull down the first data transfer line;
   a second PMOS transistor for receiving an output of the second NOR gate via a gate to pull up the second data transfer line; and
   a second NMOS transistor for receiving the signal latched by the second latch circuit via a gate to pull down the second data transfer line.

17. A semiconductor memory device comprising:
   a first data transfer line;
   a second data transfer line;
   a reset circuit for resetting the second data transfer line to a reset voltage in response to a reset signal; and
   a driver for driving data of the first data transfer line to the second data transfer line,
   wherein the driver resets the second data transfer line to the reset voltage in response to the reset signal.

18. The semiconductor memory device as recited in claim 17, wherein the second data transfer line is composed of a first and a second data line to transmit a pair of data signals.

19. The semiconductor memory device as recited in claim 18, further comprising an equalization circuit for equalizing a voltage level of each of the first and second data lines included in the second data transfer line in response to the reset signal.

* * * * *